June 28, 1960 C. DODGE 2,943,268
AUTOMATIC GAIN CONTROL AMPLIFIER CIRCUIT
Filed July 30, 1957
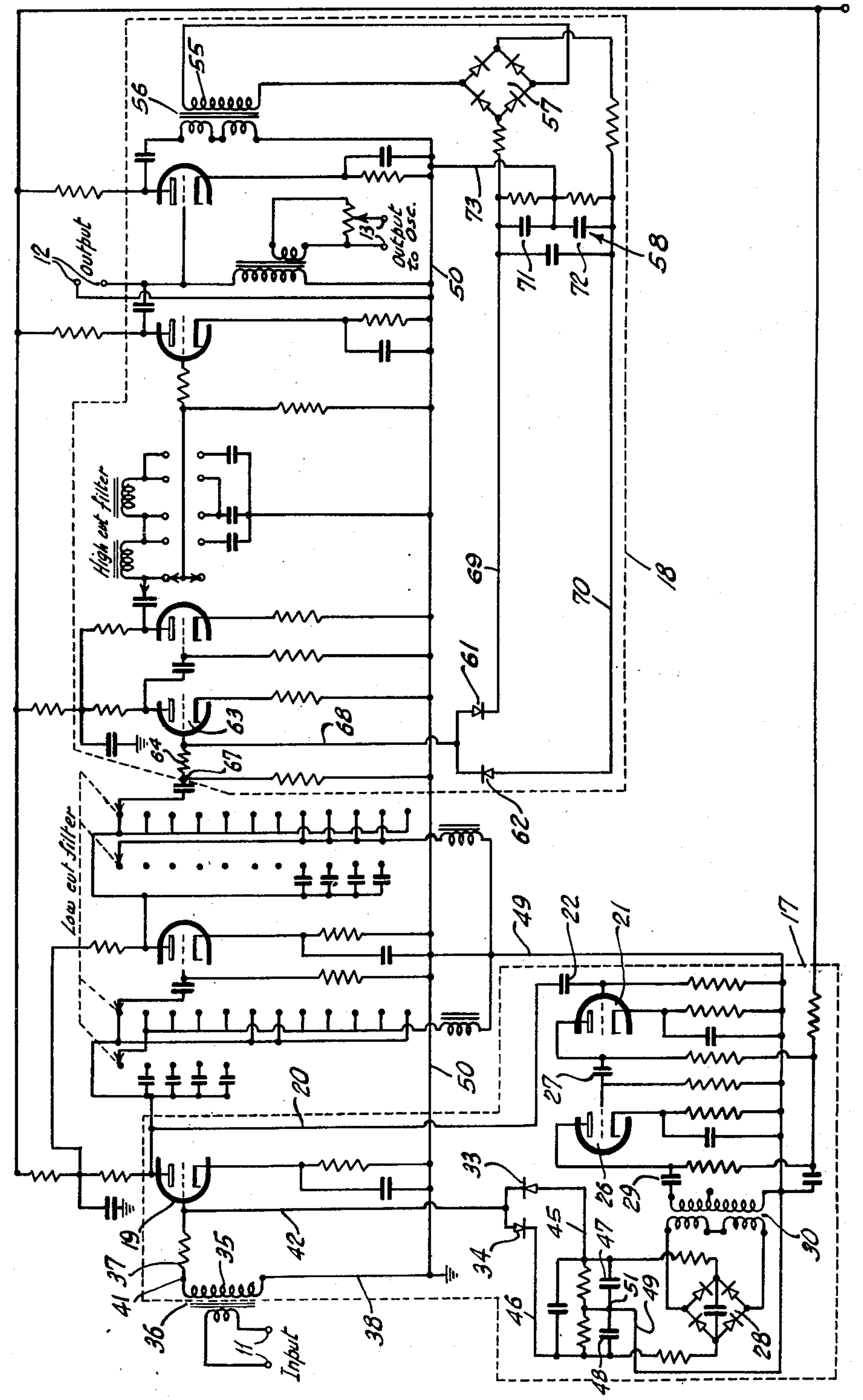

United States Patent Office 2,943,268

Patented June 28, 1960

2,943,268

AUTOMATIC GAIN CONTROL AMPLIFIER CIRCUIT

Carl Dodge, Bellaire, Tex., assignor to Texaco Inc., a corporation of Delaware

Filed July 30, 1957, Ser. No. 675,059

2 Claims. (Cl. 330—145)

This invention is concerned with an improved automatic gain control amplifier. More specifically the invention relates to, or is specially adapted for use with a seismic amplifier, where the range of amplitude variation of input signals is extremely great. Also in seismic amplifiers, a distortionless reduction in the amplitude of the signals is required.

Heretofore there has been in the field of seismic exploration equipment, a need for wide range automatic gain control amplifiers which have the ability to reduce signal amplitude without distorting the wave form or frequency, or shifting the phase. One of the best circuits that has been found is one that employs a so-called losser circuit. However, there have been difficulties even where such a losser circuit is used, because the circuit has been found to be relatively unstable by reason of various effects. Among these effects which create difficulties, has been the fact that: where thermionic diodes were employed in the losser circuit, the resistance of such diodes varied with slight changes in heater supply voltage so that variations in the nature of extraneous signals were thus introduced. Furthermore, thermionic diodes are relatively bulky in size and in addition such diodes are difficult to match closely for use in pairs, as is required. Also, the use of a bias voltage was required with such diodes in the losser circuit.

Difficulties were also found to exist where it was attempted to employ germanium diodes in the losser circuit. It was found that such germanium diodes are quite temperature sensitive, and therefore caused unstable operation. In addition the use of a bias source was necessary where germanium diodes were employed.

Consequently it is an object of this invention to overcome the above difficulties by making use of the discovery that by employing silicon junction diodes in the losser circuit of such an automatic gain control amplifier circuit; a stable, distortion free system may be had.

Another object of this invention is to provide a wide range, distortionless automatic gain control circuit that is compact in structure and free from instabilities due to temperature changes.

Another object of the invention is to provide an automatic gain control losser circuit that makes use of two separate non-overlapping feedback loops for obtaining a wide range automatic gain control action.

Yet another object of this invention is to provide an automatic gain control amplifier employing a losser circuit where the need for use of a bias voltage in the losser circuit is eliminated.

Briefly, the invention is concerned with the use of a silicon junction diode in the losser circuit of an automatic gain control amplifier circuit.

One embodiment of the invention is described below in considerable detail, and is illustrated in the drawing, in which:

The figure of drawing shows a schematic circuit diagram illustrating an automatic gain control amplifier employing a losser circuit according to the invention.

Referring to the drawing it is pointed out that there is illustrated a multiple stage amplifier having an input circuit between a pair of terminals 11 and an output circuit terminating at a pair of output terminals 12, as indicated by the captions. There is an additional output that may be taken off from a pair of terminals 13. Output 12 is provided for the situation where the signals are to be fed into the modulator of a magnetic tape recording system. Output terminals 13 have the caption "output to osc," which indicates an output for feeding a recording oscillograph.

It will be observed that there are two feedback loops 17 and 18, which are shown enclosed in dashed lines. These feedback loops are the part of the circuit where the automatic gain control action is obtained. These particular feedback circuits are termed "losser" circuits for the reason that the action obtained by these circuits is in effect that of a variable potentiometer, or a voltage divider arrangement. Thus, there is a reduction in the amplitude of the signal without any distortion due to reactance components.

To explain this variable potentiometer action reference may be had to the first feedback loop 17 where it will be observed that the signals from the output side of a first amplifier tube 19, are fed back to cause a gain control action on the grid circuit thereof. This feedback loop may be followed over the illustrated circuit which includes a circuit wire 20 that is connected to the plate of tube 19 and carries the signals to the input or grid circuit of an amplifier tube 21, via a capacitor 22. The signals are then passed along from the output of tube 21, to a succeeding amplifier tube 26 via coupling capacitor 27. The signal is then carried to a full wave rectifier bridge 28 via the illustrated coupling circuit which includes a capacitor 29 and coupling transformer 30. The rectified D.C. signal in the output of bridge 28 is filtered by the illustrated network and applied across a pair of silicon junction diodes 33 and 34. These diodes 33 and 34 are connected in circuit with the grid of the amplifier tube 19 so that a voltage divider, or potentiometer circuit, is provided across the input signal as it is applied to the grid of the tube 19. This input signal is thus applied from a secondary winding 35 of an input transformer 36. The potentiometer comprises a resistance path across the input source, which path includes the pair of silicon diodes 33 and 34. The circuit of this path lies in parallel with the secondary, or output, winding 35 and may be traced from the upper end of winding 35 (as viewed in the drawing) to ground. The lower end of the winding 35 is directly connected to ground also, by means of the wire 38 illustrated. The circuit of the potentiometer resistance path may be traced as follows: Beginning at a point 41 which is at the upper terminal of winding 35, the circuit may be followed over a grid coupling resistor 37, and then via a circuit wire 42 to opposite polarity terminals of the diodes 33 and 34 in parallel. Then the circuit continues over the parallel branches including diodes 33 and 34 and the circuit elements involved in introducing the resistance-controlling D.C. voltage across the diodes. These circuit elements include, as the main path for signals passing over the potentiometer circuit to ground, a pair of circuit wires 45 and 46 to the ends of a pair of capacitors 47 and 48. The other end of these two capacitors 47 and 48 are connected to a common point 51, so that the circuit may be continued via a wire 49 to a common ground wire 50 in the main amplifier circuit.

It is pointed out that the action of the above described losser circuit is such that advantage is taken of the variation in resistance of diodes 33 and 34, as a variable D.C. potential is applied thereacross. Thus a voltage divider or potentiometer is provided, with the grid of amplifier tube 19 connected to some point on the voltage dividing resistance across the secondary winding 35, which point varies electrically as to the percentage of the entire voltage drop of the input signal, that is applied to the grid. Such percentage variation is caused by the variation of the resistance values of diodes 33 and 34 relatively to the resistance of resistor 37 which remains constant.

It is to be noted that the second feedback loop 18 is substantially the same in operation as was the abovedescribed feedback loop 17. The only difference lies in the fact that loop 18 includes three stages of amplification of the main multiple stage amplifier circuit itself, and hence requires only one additional amplifier stage for its operation. This loop may be quickly traced as follows. A signal is taken from a secondary winding 55 of a transformer 56 and applied across the input of a rectifier bridge 57. Then the output of the rectifier bridge 57 is connected across a filter network 58 that is also connected across a pair of silicon diodes 61 and 62. These silicon diodes 61 and 62 are connected as the variable resistance element of the losser circuit that is connected to the grid of an amplifier tube 63 in the main amplifier circuit. Here again the potentiometer, or voltage divider circuit as connected to the grid circuit of tube 63, includes a fixed grid coupling resistor 64 and the variable resistance of parallel connected diodes 61 and 62. The variable resistance effect of the diodes is effective to provide the voltage dividing action in the same manner as previously described.

In this case the potentiometer resistance-path of the losser circuit for feedback loop 18 may be traced as follows. Beginning at a point 67, the input circuit for the tube 63 may be traced over the fixed resistor 64 and a circuit wire 68 to the parallel connected opposite polarity electrodes of diodes 61 and 62 in common. Then from the other electrode of each of the diodes 61 and 62 over the circuit elements involved in introducing the resistance-controlling D.C. voltage across the diodes. These circuit elements include, as the main path for signals passing over the potentiometer circuit to ground, a pair of parallel circuits which are carried via wires 69 and 70 respectively, to the ends of a pair of capacitors 71 and 72 in the filter 58. The other ends of these capacitors 71 and 72 are connected in common to a circuit wire 73 that leads to the common ground circuit wire 50 of the main amplifier.

It is pointed out that, although a circuit in the nature of part of that described above, has been heretofore known; the variable resistance elements of the losser circuit employed therein were made up of thermionic diodes. In such case it was necessary to employ a bias voltage connected in series with the losser diodes, in order to set the range of the resistance values of the diodes for the desired action. However, in accordance with this invention, it was discovered that by making use of silicon junction diodes, no such bias voltage is needed for the reason that the resistance of the silicon diodes at zero bias is as high as one megohm or more which is a desirable initial value for the potentiometer of the losser circuit. In the circuit described an input signal produces a rectified D.C. voltage of about one volt across both the diodes that are connected in series or about one-half volt across each diode and this reduces the resistance of the diodes and the desired action will result. Therefore, by reason of the discovery of this invention it has become possible to eliminate the need for bias voltage or bias batteries with resulting savings in space and equipment.

Furthermore, in spite of the fact that the manufacturers' specifications, in the nature of performance curves and other data, that is supplied for silicon junction type diodes; does not include any data within the range of applied voltages with which this invention is particularly concerned; it has been discovered that the characteristics are well suited to the use in a losser circuit in accordance with this invention. More specifically it has been discovered that resistance values of the silicon diodes may be varied from about one or two megohms at zero voltage, down to one one-thousandths of such resistance value, i.e., to about one or two thousand ohms. Thus a reduction in amplitude of about one thousand to one, may be accomplished in a single losser circuit.

In addition to the above advantages that are possible by reason of the discovery of this invention, it will be noted that with the use of silicon junction type diodes, it becomes feasible to make use of two separate nonoverlapping feed back loops. Heretofore where an attempt was made to gain the wide range of amplitude variation control for the input signals that is found in seismic work, and this was attempted by using separate feedback loops; the results were unsatisfactory and found to be not feasible, for the reason that instability was found to exist. In other words, when the automatic gain control action was attempted for the greatest amplitude input signals, there was introduced a distortion in the nature of a superimposed lower frequency that appeared during the recovery of the circuit following such high amplitude input signals. This distortion rendered the use of two feedback loops impracticable prior to this invention.

As indicated above, the use of the term "losser" circuit throughout this specification, including the claims is intended to mean: that part of an automatic gain control circuit which includes a voltage controlled variable resistance in a potentiometer circuit. The variable resistance acting to variably reduce the percentage of the input signal that is applied to a given stage of the amplifier, so as to maintain a given maximum amplitude at the output. This is accomplished by applying the input signal across a fixed resistor (e.g. resistor 37) in series with a variable resistor (e.g. resistance of diodes 33 and 34 in parallel), and taking off a certain percentage of the total input signal at the junction between the fixed resistor and the variable resistor, in accordance with familiar voltage dividing, or potentiometer type, circuit connection techniques.

While a particular embodiment of the invention has been described in considerable detail in accordance with the applicable statutes, this is not to be taken as in any way limiting the invention, but merely as being descriptive thereof.

It is claimed:

1. An improved automatic gain control amplifier comprising in combination an input circuit having a losser type attenuator connected thereacross, said attenuator comprising a fixed resistor connected in series with a parallel connected pair of unbiased silicon junction diodes whereby the resistance of said silicon junction diodes is as high as one megohm or more, said diodes having the opposite polarity terminals of each connected together and to said fixed resistor at one end thereof to form a voltage divider output point, the other end of said fixed resistor being connected to one side of said input circuit, circuit means connecting said divider output point to the continuation of the input circuit of said amplifier, the other terminals of said silicon junction diodes being connected to opposite potential points of a resistance-controlling D.C. voltage, circuit means for connecting said resistance-controlling D.C. voltage for forward voltage potential relative to said diodes, said other terminals of the silicon diodes being also connected to the extremities of a pair of mid-point forming capacitors, circuit means connecting said mid-point to the other side of said first named amplifier input circuit in order to complete said voltage-dividing attenuator circuit thereacross, and feed back means from a succeeding stage of said amplifier including means for rectifying and filtering a feed back signal to provide said resistance-controlling D.C. voltage in order to vary the attenuation in accordance with the amplitude of the amplifier signals so that automatic gain control is had.

2. The invention according to claim 1 including in addition a second losser type attenuator also employing silicon junction diodes therein and being connected as a non-overlapping feedback loop relative to the loop formed by said feedback means, said second attenuator being connected across the input of a stage succeeding the stage of said feed back means for the first attenuator.

References Cited in the file of this patent

UNITED STATES PATENTS 2,369,066 Maxwell ---------- Feb. 6, 1945

2,547,703 Hermont et al. ---------- Apr. 3, 1951
2,558,002 Ross ---------- June 26, 1951
2,697,201 Harder ---------- Dec. 14, 1954
2,723,387 Slavin ---------- Nov. 8, 1955
2,769,137 Creusere ---------- Oct. 30, 1956
2,772,388 Erath et al. ---------- Nov. 27, 1956
2,811,682 Pearson ---------- Oct. 29, 1957
2,824,175 Meacham ---------- Feb. 18, 1958

OTHER REFERENCES

Shea: "Principles of Transistor Circuits," John Wiley & Sons, published 1953, particularly bottom of page 462.